United States Patent [19]

Geis et al.

[11] Patent Number: 5,002,899
[45] Date of Patent: Mar. 26, 1991

[54] ELECTRICAL CONTACTS ON DIAMOND

[75] Inventors: Michael W. Geis, Acton; Mordechai Rothschild, Newton; Daniel J. Ehrlich, Lexington, both of Mass.

[73] Assignee: Massachusetts Institute of Technology, Cambridge, Mass.

[21] Appl. No.: 498,479

[22] Filed: Mar. 22, 1990

Related U.S. Application Data

[63] Continuation of Ser. No. 251,675, Sep. 30, 1988, abandoned.

[51] Int. Cl.$^5$ .............................................. H01L 21/44
[52] U.S. Cl. .................................. 437/173; 437/175; 437/187
[58] Field of Search ................ 437/173, 175, 180, 187

[56] References Cited

U.S. PATENT DOCUMENTS

| | | | |
|---|---|---|---|
| 4,296,144 | 10/1981 | Maby et al. | 427/38 |
| 4,378,629 | 4/1983 | Bozler et al. | 29/580 |
| 4,511,783 | 4/1985 | Burgemeister | 219/121 |
| 4,571,447 | 2/1986 | Prins | 136/252 |
| 4,646,282 | 2/1987 | Mizuno | 369/126 |

FOREIGN PATENT DOCUMENTS

0086022  8/1983  European Pat. Off. .

OTHER PUBLICATIONS

Williams et al, "Impurity Conduction in Synthetic Semiconducting Diamond," J. Phys. C: Solid St. Phys., 1970, vol. 3, p. 1727.

Collins et al., "Role of Phonons in the Oscillatory Photoconductivity Spectrum of Semiconducting Diamond," Physical Review, vol. 183, No. 3, p. 725, 1969.

Custers, "Type IIb Diamonds," Physica XX, pp. 183-184, 1954.

Fujimori et al., "Characterization of Conducting Diamond Films,".

Glover, "The C-V Characteristics of Schottky Barriers on Laboratory Grown Semiconducting Diamonds," Solid State Electronics, vol. 16, p. 973, 1973.

Prins, "Bipolar Transistor Action in Ion Implanted Diamond," Applied Physical Letters, 41(10), p. 950, 1982.

Moazed et al, "Ohmic Contracts to Semiconducting Diamond," Vacuum, p. 99, 1980.

Lightowlers et al, "Electrical-Transport Measurements on Synthetic Semiconducting Diamond," Physical Review, vol. 151, No. 2, p. 685, 1966.

Bazhenov et al, "Synthetic Diamonds in Electronics (Review)", Sov. Phys. Semicond, 19(A), p. 829, 1985.

Geis et al, "Graphoepitaxy of Germanium on Gratings with Square-Wave and Sawtooth Profiles," Appl. Phys. Lett. 41(6), 1982.

Efremow et al, "Ion-Beam-Assisted Etching of Diamond," Jour. V. Sci. Tech., B3(1), p. 416, 1985.

Geis et al, "Crystalline Silicon on Insulators by Graphoepitaxy", IEEE, 1979.

Sze, Physics of Semiconductor Devices, Bell Lab. Inc., 1981, 30 30.

IEEE Electronic Device Letters, vol. EDL-8, p. 341, 1987.

Rothschild et al, "Excimer-Laser Etching of Diamond and Hard Carbon Films by Direct Writing and Opticl Projection," Jour. Vacuum Sc. Tech., B4(1), p. 310, 1986.

(List continued on next page.)

Primary Examiner—Olik Chaudhuri
Assistant Examiner—Andrew Griffis
Attorney, Agent, or Firm—Fish & Richardson

[57] ABSTRACT

A method for forming ohmic contacts on diamond substrates, where, by irradiating a diamond substrate with radiation having a wavelength in the neighborhood of 193 nm, regions of enhanced electrical conductivity may be formed without substantially heating the substrate surface. Metal films may be applied to obtain ohmic or Schottky type contacts on the irradiated sites. The invention may be used to form regions of anisotropic and isotropic enhanced conductivity. Regions of anisotropic conductivity may be employed as polarizing optical devices.

22 Claims, 2 Drawing Sheets

OTHER PUBLICATIONS

Vavilov et al, "Electronic and Optical Processes in Diamond," *Nauka Publishing House, Moscow Office of Physico-Mathematical* manuscript of unknown origin dated Feb. 22, 1988.

Moazed et al, "Electrical Contacts to Semiconducting Diamond," *Fiscal Year '87 Annual Report SDIO/ONR Crystalline Carbon Materials*, 1987.

Geis et al., "High-Temperature Point-Contact Transistors and Schottky Diodes Formed on Synthetic Boron-Doped Diamond".

Huo et al, "Optical Switching Mechanisms in Type IIa Diamond", *J. Appl. Phys*; vol. 59, Mar. 1986, pp. 2060–2067.

Enckevort, "The Effect of Crystallographic Orientation on the Optical Anistropy of Graphite Layers on Diamond Surfaces", *J. Appl. Cryst.* (1987), 20, p. 11.

ELECTRICAL CONTACTS ON DIAMOND

The U.S. Government has non exclusive rights in this invention pursuant to contract number F19628-85-C-0002 awarded by the Department of the Air Force.

This is a continuation of application U.S. Ser. No. 251,675, filed Sept. 30, 1988, now abandoned.

BACKGROUND OF THE INVENTION

This invention relates to the fabrication of semiconductor material for use in electronic devices, and more particularly, to the fabrication of electrical contacts on diamond.

Diamond is a material with semiconductor properties that are superior to the more commonly used Silicon (Si), Germanium (Ge) or Gallium Arsenide (GaAs). In particular, diamond provides a higher band gap, a higher breakdown voltage and a greater saturation velocity, all of which produces a substantial increase in its projected cutoff frequency and maximum operating voltage compared to devices fabricated from Si, Ge, or GaAs. Furthermore, diamond has the highest thermal conductivity of any solid at room temperature and excellent conductivity over a temperature range up to and beyond 500° K. Diamond therefore holds the potential for efficient semiconductor operation at high frequency and power. Finally, diamond, by virtue of its small molecular size compared to other materials, provides a smaller neutron cross-section which reduces its degradation rate in radioactive environments.

Unfortunately, however, the advantages of diamond as a semiconductor have not been exploited because of the difficulty in forming electrical contacts on diamond surfaces. This difficulty is attributed to a large potential energy barrier at the metal-semiconductor interface. This barrier results in an impractically high electrical impedance. Nonetheless, it is desirable to be able to form ohmic contacts (i.e., those whose resistance to current flow is symmetrical with respect to direction of flow) on diamond.

Numerous attempts to solve this difficulty, as reported in the scientific literature, are reviewed by Moazed et al. in "Electrical Contacts to Semiconducting Diamond", *FY87 Annual Report SDIO/ONR Crystalline Carbon Materials*, October, 1987. These attempts fall into either one of two major categories: (1) those attempts at increasing conductivity by doping or by applying metals directly to the diamond substrate surface, and (2) those attempts which employ graphite as a conductor between the substrate surface and a metallic contact.

In this first category, it has been found that the conductivity of a contact may be increased (although the barrier height is not decreased) by heavily doping the region of the diamond substrate about the area at which the contact is to be formed. In this way, the conductivity may be improved by increasing the electron, or hole, tunneling probability. (Tunneling is a quantum phenomenon which results from the overlap of electron probability distributions between adjacent atoms. Such overlap provides a finite probability that an electron, or hole, of one atom may be transported, or may "tunnel", to an adjacent atom, and may thereby lead to a conducting state.)

Application of a metal directly to a diamond substrate, the surface of which substrate has been purposely roughened, has likewise shown an improvement of conductivity, but not an improvement in the formation of ohmic contacts. Ohmic contacts have been formed, however, by evaporating titanium or tungsten and condensing the metal onto p-type diamond. The diamond, with the metal coating, is then heated to 1000° C. for 30 minutes in a vacuum. The metal is believed to react with the diamond in this heating step to form a carbide, thereby forming ohmic contacts. Unfortunately though, titanium is found to adhere weakly to a substrate and may even flake off during the heating step and while tungsten produces satisfactory contacts, it still requires high temperatures. A further problem with using metal for ohmic contacts is that an additional etch step is required to remove metal from non-ohmic areas during device fabrication.

In fact, the heating step required of these last two techniques inhibits their use, since silicon, the most common substrate for integrated circuit manufacture, tends to warp at the 1000° C. temperatures required for contact formation. Such warping may thereby reduce the overall quality of devices on the wafer and may render the wafer unsuitable for automated chip processing. Furthermore, aluminum, which is the most common material used for creating contacts on integrated circuits, melts at about 660° C. which is well below the high temperatures required for this manner of contact formation, and therefore must be put down after ohmic formation.

Another method for forming contacts directly on the diamond surface, which we have investigated in our laboratory, is the application of indium to diamond, which forms ohmic contacts at considerably lower temperatures than many other metals. Unfortunately, the low melting point (175° C.), and softness of this metal, make for a rather fragile contact which cannot be subjected to semiconductor processing at temperatures above the indium melting point.

Known methods which fall into the second category of forming contacts on diamond are those which employ a conducting graphite layer on the substrate to which a metal conductor may be applied. We have investigated in our laboratory the formation of ohmic contacts by carbonizing photoresist on diamond at 1000° C. for 30 minutes. However, evaporated metals adhere poorly to the carbonized resist.

Another method in the second category includes heating diamond in an argon atmosphere with one to a few p.p.m. oxygen to a temperature of 1273 to 1373K to form a layer of graphite on the diamond, as reported in W. J. P. von Enckevort, The Effect of Crystallographic Orientation on the Optical Anisotropy of Graphite Layers on Diamond Surfaces, J. App. Cryst. (1987) 20, 11-15. This graphite coating, however, can be easily removed by rubbing the crystal surface with a metal needle. Such coating therefore is not adequate from production-grade devices. These methods, of course, also suffer the same disadvantage as the metal evaporation methods discussed above arising from the high temperature required in each process.

Yet another method for producing electrical contacts on a diamond substrate using a conducting graphite layer is disclosed by Burgermeister in U.S. Pat. No. 4,511,783. In this technique, a laser beam impinges upon a diamond surface transforming the irradiated area into a graphite layer. An electrical connection may then be made to the layer. More particularly, the surface of a diamond crystal is first painted over at the area to be graphitized with an infrared absorbing agent. An ND- YAG laser, at an operating wavelength of 1.06 nm, is then impinged upon the painted region and the power density of the beam is adjusted in such a way that it is sufficiently high to heat and melt a surface layer of the crystal. Subsequently, carbon atoms in the melted layer recrystallize as graphite.

Burgermeister's process of graphitizing the surface by melting has the disadvantage of heating the substrate to high temperatures. Although this laser technique performs more localized heating than various other methods discussed above, as heat is conducted outside the desired irradiated region, the neighboring crystal area ma be damaged.

These known methods for producing contacts are thus useful only for experiment, and are generally considered unsatisfactory for production. Therefore, there is a felt need for producing robust, localized electrical contacts on diamond substrates without excessively increasing the substrate temperature.

SUMMARY OF THE INVENTION

It is one aspect of the present invention to provide a method of forming electrical contacts on diamond without substantially heating the diamond by selecting a prepared diamond substrate, placing the substrate in the path of a light source capable of providing radiation with a wavelength in the neighborhood of 193 nm, and irradiating the substrate to form a region of enhanced conductivity.

It is another aspect of the present invention to provide a method of forming a region of enhanced electrical conductivity on a diamond substrate such that the conductivity is uniformly enhanced in all directions by selecting a prepared diamond substrate, placing the substrate in the path of a light source capable of providing radiation with a wavelength in the neighborhood of 193 nm, and irradiating the substrate with two pulses from the light source, each pulse having an intensity of approximately 20 Mw/cm$^2$ and a duration of perhaps 10 nanoseconds, to form a region of enhanced conductivity.

It is yet another aspect of the present invention to provide a method for forming a polarizing optical device by selecting a prepared diamond substrate, placing the substrate in the path of a light source capable of providing radiation with a wavelength in the range of 193 nm and irradiating the substrate to produce a region with enhanced conductivity, such that the conductivity in a first direction is greater than the conductivity in a second direction, normal to the first direction, thereby providing a region having the property of polarizing incident light.

DESCRIPTION OF THE PREFERRED EMBODIMENT

Figure 1:
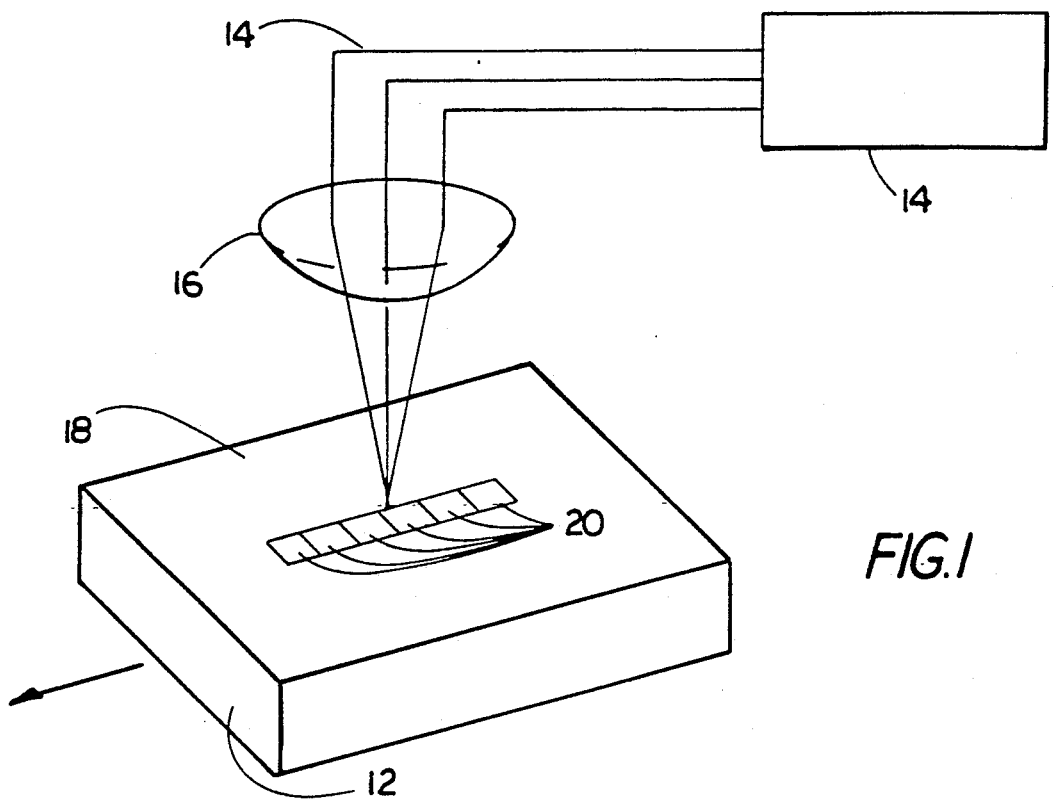
FIG. 1 is a schematic of a diamond substrate being irradiated with light of approximately 193 nm from an ArF laser.

The present invention will now be described first with reference to FIG. 1, which is a schematic diagram of a diamond substrate irradiated according to the invention, wherein a prepared diamond substrate 12 is positioned in the path of light source 14. This source is preferably capable of providing light having a wavelength at approximately 193 nm. This light is directed, via mirror 15 and focusing element 16, to irradiate surface 18 of substrate 12, and thus to create region of enhanced conductivity 20.

Essentially, we have discovered that after irradiation at sufficient intensity, the region upon which the light has been impinged shows enhanced conductivity compared to the unirradiated area. Furthermore, the temperature of the substrate is not significantly raised during the irradiation process and no significant graphite layer at the substrate surface is found.

In a preferred embodiment, the light source is an ArF excimer laser with a beam diameter focused to 30 $\mu$m by a microscope, and providing a beam energy of 20 Mw/cm$^2$ (joules). A single laser pulse of 10 nanoseconds in duration is used to create the region of enhanced conductivity. This region may then be used as a rapidly created, robust electrical contact accessing the diamond for the purpose, for example, of producing diamond semiconductor devices. Alternatively, metal films may be applied to obtain ohmic or schottky type contacts at the irradiated sites.

We have further discovered that irradiating a diamond substrate with a single light pulse at 193 nm for a 10 nanosecond duration at 20 Mw/cm$^2$ produces a region of enhanced conductivity in which conductivity in a first direction is greater than that in a second direction normal to the first direction. This anisotropy suggests the creation of ordered paths of conducting diamond, perhaps understood as many separate ordered conductors, created in the surface of the impinged diamond. Furthermore, by applying at least a further pulse and perhaps several pulses to this region, the enhanced conductivity region exhibits uniform conductivity in all directions within the plane parallel to the surface of the diamond. This isotropy then suggests that the separation between the abovementioned separate conductors in a singly irradiated region has been negated.

Figure 2:
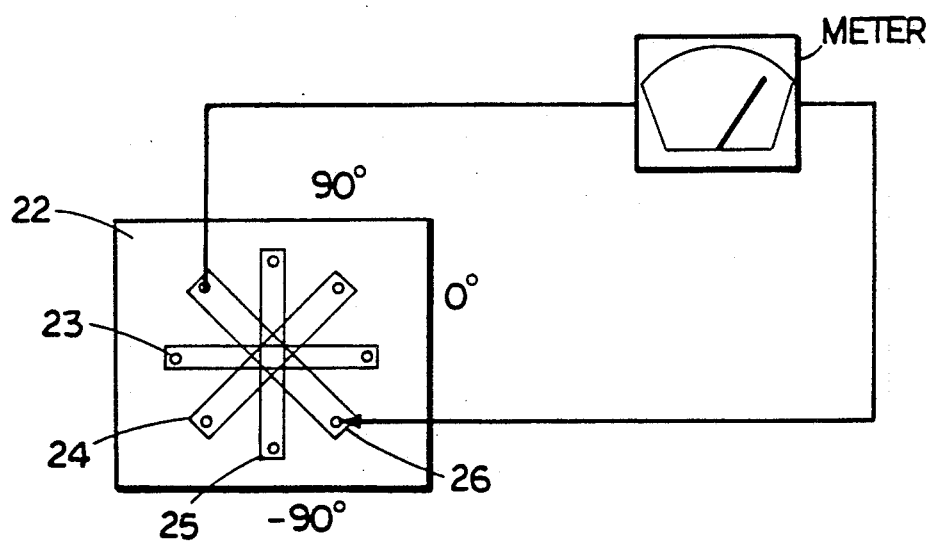
FIG. 2 is a conceptual view of an irradiated workpiece coupled to an ohmmeter.

Referring now to FIG. 2, there is shown a conceptual view of an irradiated workpiece coupled to an ohmmeter. More particularly, workpiece 22 is shown having been irradiated in practice of the present invention to create four substantially anisotropic intersecting irradiated regions 23–26, resulting from impinging a single pulse upon the surface. The pattern of intersecting regions shown in FIG. 2 is created by overlapping formation of the four regions of enhanced conductivity, where laser to substrate orientation has been maintained at a constant. The hash marks drawn on regions 23–26 indicate parallel conductors formed in each location where a single impingement has been made. The darkened area indicates multiple laser impingements as destroy this anisotropy. Regions 24, 25 and 26 are respectively distributed at 45, 90 and −45 degrees relative to the first region at zero degrees. Conductivity of regions 23-26 is determined by the orientation of the conductors within each region and as measured by applying an ohmmeter to each region, as suggested by the arrangement of FIG. 2.

In one experiment it was found that conductivity of region 23 was approximately one ohm relative to three ohms both for region 24 and for region 26, and ten ohms for region 25. These results seem to confirm the existence of a directional structure created within the once irradiated regions.

Figure 3:
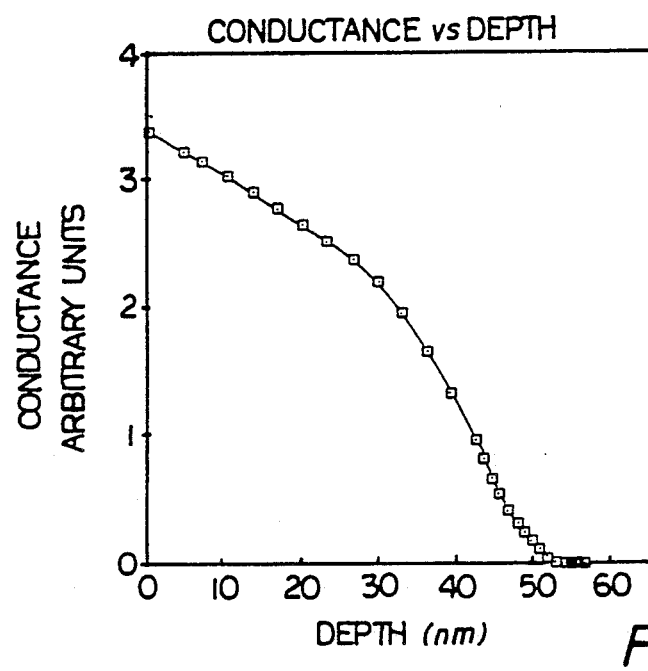
FIG. 3 is a graphic representation conductance as a function of depth of a region of a diamond substrate which has been irradiated according to the invention.

Turning now to the graphic representation of FIG. 3, conduction as a function of depth in an irradiated region is shown, where conductance is plotted in arbitrary units on the Y axis and depth in nanometers is plotted on the X-axis. The curve shows conductance to fall relative to depth into the irradiated region, suggesting that the irradiation process of the invention has indeed converted the impinged diamond surface from non-conducting to conducting up to a depth of perhaps 40 to 50 nanometers. The substrate much beyond 50 or 55 nanometers appears to have been unchanged by the particular irradiation disclosed above.

In practice of the present invention, it has been found that the use of an ArF laser at 20 Mw/cm$^2$ for approximately 10 nanoseconds does not create substantial graphite at the surface of the diamond workpiece. Even so, high power or longer exposure times can produce a graphite layer, such as a non-adhering dust, which can be removed by cleaning the diamond surface in any conventional manner.

Figure 4:
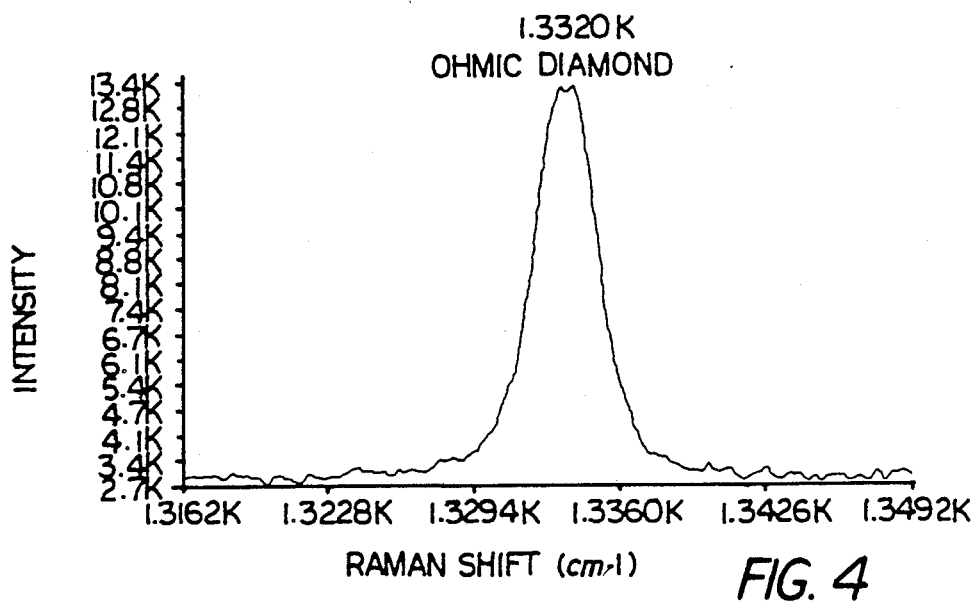
FIG. 4 is a chart of a Raman spectrum analysis performed on a diamond surface after irradiation according to the present invention showing a substantial frequency shift characteristic of ungraphitized diamond.

Our tests indicate that ohmic contacts produced in practice of the invention are substantially without graphite. As seen in FIG. 4, the results of a Raman spectrum analysis of an irradiated diamond surface in practice of the present invention is shown, where intensity (as counts of photons per second) is plotted on the Y-axis against the Raman shift plotted on the X-axis. Raman spectroscopy, as is known in the art, detects the scattering of incident light by a mechanism involving the complex molecular vibrational modes of a material. The frequency of the scattered light is dependent on the frequency of the molecular vibrational mode of the material, which in turn is substantially unique from one material to the next. In this way, then, a material may be identified by detecting its Raman scattered light signature.

As can be seen in FIG. 4, the irradiated diamond surface yields an intensity focused at 1332.0 (cm$^{-1}$), which is the well-known Raman response for diamond crystal. This result indicates the substantial absence of graphite on the treated surface and the substantial presence of diamond, as was confirmed by use of the Reflection Electron Diffraction and the X ray diffraction methods of crystal analysis.

In a further test, a diamond substrate was irradiated according to the invention and then washed with a solution of CrO$_3$ and H$_2$SO$_4$ at 200° C., which is known as a cleaning regimen for diamond for the removal of graphite. The conductivity of the irradiated region was measured before and after this washing. The result indicated that the contact region was still substantially ohmic. Although contact resistance approximately doubled, the region was still fully serviceable as an ohmic contact.

In an additional test, the diamond substrate was irradiated according to the invention and subjected to a plasma of He and O$_2$. This is a technique commonly employed for cleaning surfaces; it removes surface impurities, such as graphite, with oxidants formed in a plasma above the surface to be treated. No effect upon the conductivity of the irradiated region was detected, before and after the test, again indicative of a graphiteless contact region.

The foregoing characterizations of the conductivity enhanced regions created by the present invention indicate that the mechanism by which this technique operates does not involve substantial formation of graphite at the substrate surface. The irradiated substrate apparently remains crystalline diamond, although it is converted from non-conducting to conducting. It is speculated that such change is a result of crystal defects formed in the first 50 mm of the diamond surface.

The present invention has many beneficial uses in the production of diamond semiconductor devices, such as the formation of ohmic contacts on vertical devices. For example, ohmic contacts may be formed in practice of the present invention in a permeable base transistor constructed from boron-doped semiconducting diamond. The transistor is provided with metal contacts formed over regions irradiated according to the invention to create a base, collector, and emitter. The first contact is a schottky type contact produced by providing a layer of vacuum deposited SiO$_2$ between a metallization layer and the irradiated diamond surface, and the latter two contacts are ohmic contacts formed by applying the metallization directly to the irradiated diamond surface.

This vertical device is only one of several devices which may be created in practice of the present invention. The preferred process of forming ohmic contacts is as follows:

1. growing an oriented diamond polycrystalline film on a conducting substrate of nickel, carbon, or the like;
2. creating ohmic contact surfaces by irradiation according to the present invention;
3. creating a grating in the film with ion beam assisted etching, and
4. evaporating metal (such as tungsten or aluminum) on the horizontal surfaces of the grating.
5. where Schottky type contacts are desired, an insulating layer of SiO$_2$ is first applied to the diamond surface before metallization. Furthermore, it has been found that formed ohmic contacts can be etched with the same ion beam as listed etching technique used to etch the underlying diamond.

As discussed earlier with respect to FIG. 2, we have discovered that impinging a diamond surface with a single pulse of light having a wavelength of approximately 193 nm, and which is approximately 10 nanoseconds in duration, produces anisotropic regions of enhanced conductivity on the diamond substrate. As mentioned above, ohmic tests confirm a directionality of structure in the anisotropic sample. A further property of these anisotropic regions is that light transmitted through them becomes polarized. Hence, when polarized light of wavelengths 400-800 nm was impinged upon a region of a diamond crystal which had been irradiated with a single 10 nm pulse of light from an ArF laser at 20 Mw/cm$^2$, transmission intensity varied according to orientation of the workpiece.

Figure 5:
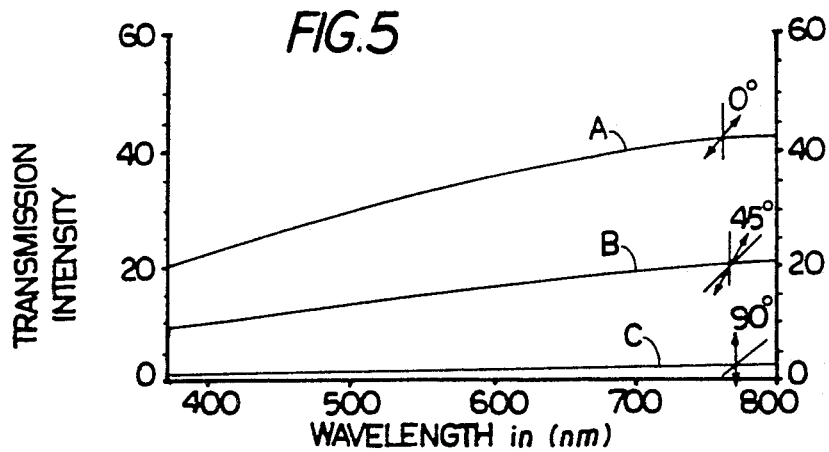
FIG. 5 is a graphic representation of the broad-band polarization effect of the invention, where the transmission intensity of polarized light as a function of wavelength for three different orientations of a workpiece subjected to a polarized source of light is shown.

This polarization effect will be further understood by reference to FIG. 5, which is a graphic representation of the broad band polarization effect of the present invention, where transmission intensity (as a percent of clear air medium at one hundred percent) is plotted on the Y-axis against wavelength (from about 390 to 800 nanometers) plotted on the X-axis. Three curves A, B, C are shown, representing three different orientations of the workpiece to the polarized light source ranging from maximum to minimum transmissivity. The first orientation (producing curve A) was set at maximum transmission, arbitrarily designated as zero degrees. The oriented workpiece thus is shown to be transmissive at about 20 percent of the clear air medium baseline in the ultra-violet/blue (about 390 nanometers) range of the visible spectrum to about 43 percent in the red/infrared (about 800 nanometers) range of the visible spectrum.

The workpiece was next rotated to a 45 degree orientation as represented by curve B, showing an approximately 50 percent reduction in transmission, as would be expected from a polarizing filter. The workpiece finally is rotated to a 90° orientation and shows minimal transmission, again as would be expected from a polarizing filter. Hence it will be appreciated that practice of the present invention can result in broad band polarizers, with a transmission to blocking ratio in the range of 14:1 or better over a very broad spectrum. Polarizers made in practice of the present invention are robust, and have been shown to withstand at least baking at 1200° C. for one hour.

Several modifications and variations of the present invention are possible when considered in the light of the above teachings. It is therefore understood that the scope of the present invention is not to be limited to the details disclosed herein, may be practiced otherwise than as specifically described, and is intended only to be limited by the claims appended hereto:

What is claimed is:

1. A method for forming an electrical contact on a diamond electrical component substrate by creating a region of enhanced conductivity in said diamond component substrate suitable as an electrical contact without substantially heating said electrical component substrate, comprising the steps of:
   selecting a prepared diamond electrical component substrate;
   placing said substrate in the beam path of a light source capable of providing light of approximately 193 nm wavelength;
   irradiating said substrate with said light from said source to create a substantially non-graphite region of sustained, enhanced conductivity in said substrate; and,
   employing said region as an electrical contact to said diamond substrate.

2. The method of claim 1, wherein the intensity of said light is approximately 20 Mw/cm$^2$.

3. The method of claim 1, wherein the intensity of said light is greater than 20 Mw/cm$^2$.

4. The method of claim 2, wherein said light irradiates said crystal for approximately 10 nanoseconds.

5. The method of claim 1, wherein the source of said light is an ArF excimir laser.

6. The method of claim 2, wherein the source of said light is an ArF excimir laser.

7. The method of claim 5, wherein said laser provides a single pulse of said light approximately 10 nanoseconds in duration.

8. The method of claim 6, wherein said laser provides a single pulse of said light approximately 10 nanoseconds in duration.

9. The method of claim 1, further comprising the step of irradiating a plurality of adjacent regions such that said regions are in electrical contact forming a single region of enhanced conductivity.

10. The method of claim 1, further comprising the step of irradiating said region at least a second time so that said region is equally conductive in all directions.

11. The method of claim 9, further comprising the step of irradiating said region at least a second time so that said region is equally conductive in all directions.

12. The method of claim 10, further comprising the step of providing an electrical connection to said region.

13. The method of claim 1, further comprising the step of placing a metallic conductor on said irradiated region to form an ohmic type contact.

14. The method of claim 1, wherein said diamond substrate is p-type diamond.

15. The method of claim 1, wherein said diamond substrate is n-type diamond.

16. The method of claim 1 wherein said removing comprises removing said graphite during irradiation by control of the power and exposure time.

17. The method of claim 1 wherein said removing comprises washing said substrate.

18. The method of claim 1 wherein said removing comprises plasma treatment of said surface.

19. The method of claim 1 wherein said region is graphiteless.

20. A method of forming a polarizing optical device comprising the steps of:
    selecting a prepared diamond substrate;
    placing said substrate in the beam path of a light source capable of providing light of approximately 193 nm wavelength;
    creating a polarizing region on said substrate by irradiating said substrate with said light from said source to produce a region of enhanced conductivity, said region being more conductive in a first direction than a second direction, and said region having the property of polarizing incident light; and
    employing said region as a polarizing optical device.

21. The method of claim 20 wherein the intensity of said light is approximately 20 Mw/cm$^2$.

22. The method of claim 1 wherein said light irradiates said crystal for approximately 10 nanoseconds.

* * * * *

UNITED STATES PATENT AND TRADEMARK OFFICE
CERTIFICATE OF CORRECTION

PATENT NO. : 5,002,899            Page 1 of 2

DATED : March 26, 1991

INVENTOR(S) : Michael W. Geis et al

It is certified that error appears in the above-indentified patent and that said Letters Patent is hereby corrected as shown below:

On the title page, Item [56]:

Other Publications; "Fujimori et al., "Characterization of Conducting Diamond Films,"" should be --Fujimori et al., "Characterization of Conducting Diamond Films", *Vacuum*, p. 99, 1980--.

Other Publications; "Moazed et al., "Ohmic Contracts to Semiconducting Diamond", *Vacuum*, p. 99, 1980" should be --Moazed et al., "Ohmic Contracts to Semiconducting Diamond", Manuscript of unknown origin dated February 22, 1988--.

Other Publications; "Sze, *Physics of Semiconductor Devices*, Bell Lab, Inc., 1981, 30 30" should be --Sze, *Physics of Semiconductor Devices*, Bell Lab, Inc., 1981, 30--.

Other Publications; in "Rothschild et al."; "Opticl" should be --Optical--.

UNITED STATES PATENT AND TRADEMARK OFFICE
CERTIFICATE OF CORRECTION

PATENT NO. : 5,002,899

DATED : March 26, 1991

INVENTOR(S) : Michael W. Geis et al

It is certified that error appears in the above-indentified patent and that said Letters Patent is hereby corrected as shown below:

Other Publications; "Vavilov et al., "Electronic and Optical Processes in Diamond," *Nauka Publishing House, Moscow Office of Physico-Mathematical* manuscript of unknown origin dated Feb. 22, 1988" should be --Vavilov et al., "Electronic and Optical Processes in Diamond," *Nauka Publishing House, Moscow Office of Physico-Mathematical, Literature*, 1985--.

Other Publications; "Geis et al., "High-Temperature Point-Contact Transistors and Schottky Diodes Formed on Synthetic Boron-Doped Diamond"" should be --Geis et al., "High-Temperature Point-Contact Transistors and Schottky Diodes Formed on Synthetic Boron-Doped Diamond", *IEEE Electronic Devia Letters*, Vol. EOL-8, p. 341, 1987--.

Col. 3, line 13; "ma" should be --may--

Signed and Sealed this

Twelfth Day of July, 1994

Attest:

BRUCE LEHMAN

Attesting Officer

Commissioner of Patents and Trademarks